US011445651B2

(12) United States Patent
Ao

(10) Patent No.: US 11,445,651 B2
(45) Date of Patent: Sep. 13, 2022

(54) SUBSTRATE WORK SYSTEM

(71) Applicant: FUJI CORPORATION, Chiryu (JP)

(72) Inventor: Hiroyuki Ao, Okazaki (JP)

(73) Assignee: FUJI CORPORATION, Chiryu (JP)

(*) Notice: Subject to any disclaimer, the term of this patent is extended or adjusted under 35 U.S.C. 154(b) by 0 days.

(21) Appl. No.: 16/959,529

(22) PCT Filed: Feb. 16, 2018

(86) PCT No.: PCT/JP2018/005461
§ 371 (c)(1),
(2) Date: Jul. 1, 2020

(87) PCT Pub. No.: WO2019/159319
PCT Pub. Date: Aug. 22, 2019

(65) Prior Publication Data
US 2021/0064008 A1 Mar. 4, 2021

(51) Int. Cl.
H05K 13/08 (2006.01)
G05B 19/416 (2006.01)
H05K 13/00 (2006.01)

(52) U.S. Cl.
CPC ..... H05K 13/0895 (2018.08); G05B 19/4166 (2013.01); *G05B 2219/45054* (2013.01); *H05K 13/00* (2013.01)

(58) Field of Classification Search
CPC ...... G05B 19/4166; G05B 2219/45054; H05K 13/0895; H05K 13/00
(Continued)

(56) References Cited

U.S. PATENT DOCUMENTS

2003/0027363 A1\* 2/2003 Kodama ............ G05B 23/0289
438/14
2011/0216186 A1 9/2011 Shinyama
(Continued)

FOREIGN PATENT DOCUMENTS

CN 103597920 A 2/2014
JP 4-127600 A 4/1992
(Continued)

OTHER PUBLICATIONS

International Search Report dated Apr. 10, 2018 in PCT/JP2018/005461 filed Feb. 16, 2018, 2 pages.

*Primary Examiner* — Kenneth M Lo
*Assistant Examiner* — Mohammed Shafayet
(74) *Attorney, Agent, or Firm* — Oblon, McClelland, Maier & Neustadt, L.L.P.

(57) ABSTRACT

A substrate work system including a work device configured to perform predetermined work on a substrate by use of an exchangeable work unit includes a storage section configured to store the work unit, a maintenance device configured to perform maintenance of the work unit, a conveyance device capable of conveying the work unit, a determination section configured to determine a maintenance time for the work unit used in the work device based on quality information on work quality of the predetermined work, and a control section configured to, when the determination section determines that a maintenance time arrives, cause the conveyance device, the work device, and the maintenance device to unload the work unit, convey the work unit to the work device to exchange with the work unit that has been used, and convey the used-up work unit to the maintenance device.

4 Claims, 11 Drawing Sheets

(58) Field of Classification Search
USPC .......................................................... 700/112
See application file for complete search history.

(56) References Cited

U.S. PATENT DOCUMENTS

| | | | | |
|---|---|---|---|---|
| 2012/0277896 | A1* | 11/2012 | Uekita | G01B 11/06 |
| | | | | 700/95 |
| 2013/0083107 | A1* | 4/2013 | Nishikawa | B41J 2/04588 |
| | | | | 347/10 |
| 2013/0110464 | A1* | 5/2013 | Ishida | H05K 13/086 |
| | | | | 702/183 |
| 2015/0107075 | A1* | 4/2015 | Clarke | B25J 15/0066 |
| | | | | 29/402.08 |
| 2016/0236867 | A1* | 8/2016 | Brazeau | B65G 1/1378 |
| 2017/0004429 | A1* | 1/2017 | Maenishi | G06Q 10/06312 |
| 2018/0072060 | A1* | 3/2018 | Shindo | B41J 2/17546 |
| 2018/0272491 | A1* | 9/2018 | Yang | B23Q 17/2457 |
| 2019/0375065 | A1* | 12/2019 | Sato | B23Q 3/1554 |

FOREIGN PATENT DOCUMENTS

| | | |
|---|---|---|
| JP | 2009-81170 A | 4/2009 |
| JP | 2011-180058 A | 9/2011 |
| JP | 2011-199217 A | 10/2011 |
| JP | 2017-194921 A1 | 10/2017 |
| WO | WO 2017/033268 A1 | 3/2017 |

* cited by examiner

Fig. 8

| SUBSTRATE ID | MASK ID | PRINT PATTERN ID | PRINT STATE | | |
|---|---|---|---|---|---|
| | | | WIDTH DEVIATION | POSITIONAL DEVIATION | HEIGHT DEVIATION |
| B*** | M*** | *** | ** | (**, **) | ** |
| | | *** | ** | (**, **) | ** |
| | | *** | ** | (**, **) | ** |
| | | ⋮ | ⋮ | ⋮ | ⋮ |
| B*** | | *** | ** | (**, **) | ** |
| | | *** | ** | (**, **) | ** |
| | | *** | ** | (**, **) | ** |
| | | ⋮ | ⋮ | ⋮ | ⋮ |
| ⋮ | ⋮ | ⋮ | ⋮ | ⋮ | ⋮ |

Fig. 9

| SUBSTRATE ID | COMPONENT TYPE | COMPONENT NUMBER | MOUNTING POSITION | FEEDER ID | NOZZLE ID | MOUNT STATE | |
|---|---|---|---|---|---|---|---|
| | | | | | | POSITIONAL DEVIATION | ANGULAR DEVIATION |
| B* | * |  | (, ) | F* | N* | (, ) |  |
| | |  | (, ) | F* | N* | (, ) |  |
| | * |  | (, ) | F* | N* | (, ) | ** |
| | |  | (, ) | F* | N* | (, ) |  |
| | |  | (, ) | F* | N* | (, ) |  |
| | * |  | (, ) | F* | N* | (, ) | ** |
| ⋮ | ⋮ | ⋮ | ⋮ | ⋮ | ⋮ | ⋮ | ⋮ |

Fig. 10

| SUBSTRATE ID | COMPONENT TYPE | COMPONENT NUMBER | MOUNTING POSITION | MOUNT STATE ||
|---|---|---|---|---|---|
| | | | | POSITIONAL DEVIATION | ANGULAR DEVIATION |
| B* | * |  | (, ) | (, ) |  |
| | |  | (, ) | (, ) |  |
| | * |  | (, ) | (, ) | ** |
| | |  | (, ) | (, ) |  |
| | |  | (, ) | (, ) |  |
| | * |  | (, ) | (, ) | ** |
| | ⋮ | ⋮ | ⋮ | ⋮ | ⋮ |
| ⋮ | ⋮ | ⋮ | ⋮ | ⋮ | ⋮ |

SUBSTRATE WORK SYSTEM

TECHNICAL FIELD

This description discloses a substrate work system.

BACKGROUND ART

Conventionally, in mounting devices for picking up a component supplied from a tape feeder with a suction nozzle and mounting it on a substrate, there is proposed a substrate work system in which a tape feeder can move between a supply stage where components are supplied and a maintenance stage where maintenance work is carried out (for example, refer to Patent Literature 1). In this system, for component shortage or setup changeover, a tape feeder is automatically conveyed from the maintenance stage to the supply stage for automatic exchange of tape feeders, whereby a reduction in operating ratio is prevented.

PATENT LITERATURE

Patent Literature 1: JP-A-H04-127600

BRIEF SUMMARY

Technical Problem

In such a substrate work system, a crucial problem to be solved is not only to prevent the operating ratio from being reduced, but also to improve work quality such as a mounting accuracy, and also required is maintenance of a constituent unit such as a tape feeder in order to improve the work quality. However, the system described above does not take it into consideration that the maintenance is performed to the tape feeder by exchanging it at other timings than the timing of component shortage or setup changeover, or that other constituent units used for production, other than the tape feeder, are subjected to maintenance. In addition, in the case that an operator determines on such a maintenance timing, attempting to exchange relevant units, depending upon a timing at which the units are exchanged, the production work may have to be interrupted, resulting to reduce the operating ratio thereof.

A main object of the present disclosure is to achieve an improvement of work quality without reducing the operating ratio by enabling the maintenance of a work unit at an appropriate timing.

Solution to Problem

The present disclosure employs the following means in order to achieve the main object described above.

According to the present disclosure, there is provided a substrate work system including a work device configured to perform predetermined work on a substrate by use of an exchangeable work unit, the substrate work system including a storage section configured to store the work unit, a maintenance device configured to perform maintenance of the work unit, a conveyance device capable of conveying the work unit, a determination section configured to determine a maintenance time for the work unit used in the work device based on quality information on work quality of the predetermined work, and a control section configured to, when the determination section determines that a maintenance time arrives, cause the conveyance device, the work device, and the maintenance device to unload the work unit for exchange from the storage section, convey the work unit to the work device for being exchanged with the work unit that has been used up in the work device, and convey the used-up work unit so exchanged to the maintenance device so as to be maintained thereby.

The substrate work system of the present disclosure determines the maintenance time for the work unit used in the work device based on the quality information of the predetermined work performed on the substrate. Then, when the determination section determines that the maintenance time arrives, the work unit for exchange is unloaded from the storage section and is then conveyed to the work device for being exchanged with the work unit that has been used up in the work device, and the used-up work unit so exchange is conveyed to the maintenance device for the maintenance thereof. As a result, since the work unit can be maintained at an appropriate timing based on the quality information, which turns out improving the work quality. In addition, the substrate work system can obviate the necessity of exchange work and maintenance by the operator, and rather enables an automatic exchange of the work units at an appropriate timing according to the working status for maintenance. Consequently, the substrate work system can achieve the improvement in the work quality without reducing the operating ratio of the work device.

BRIEF DESCRIPTION OF DRAWINGS

FIG. 8 is an explanatory chart showing an example of print inspection result information.

FIG. 9 is an explanatory chart showing an example of mounting work state information.

FIG. 10 is an explanatory diagram showing an example of mount inspection result information.

DESCRIPTION OF EMBODIMENTS

Figure 1:
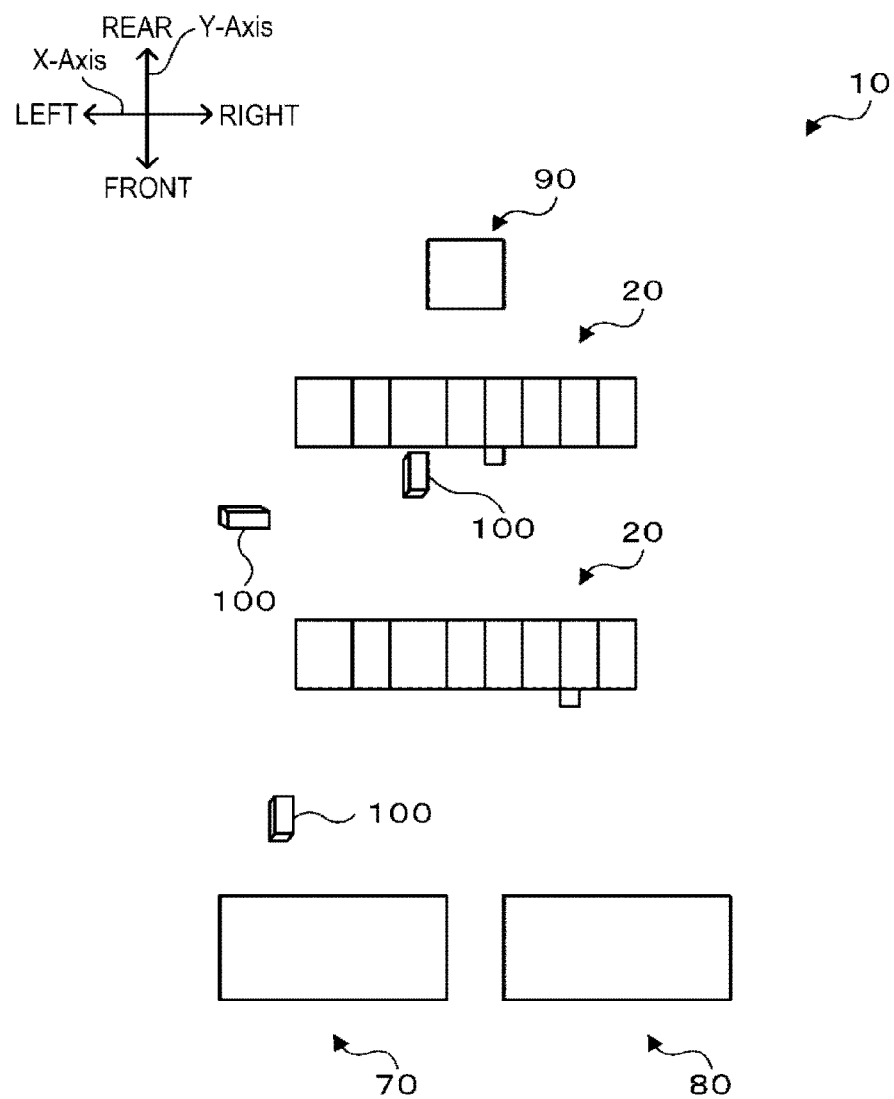
FIG. 1 is an explanatory diagram showing an example of a summary configuration of substrate work system 10.
Figure 2:
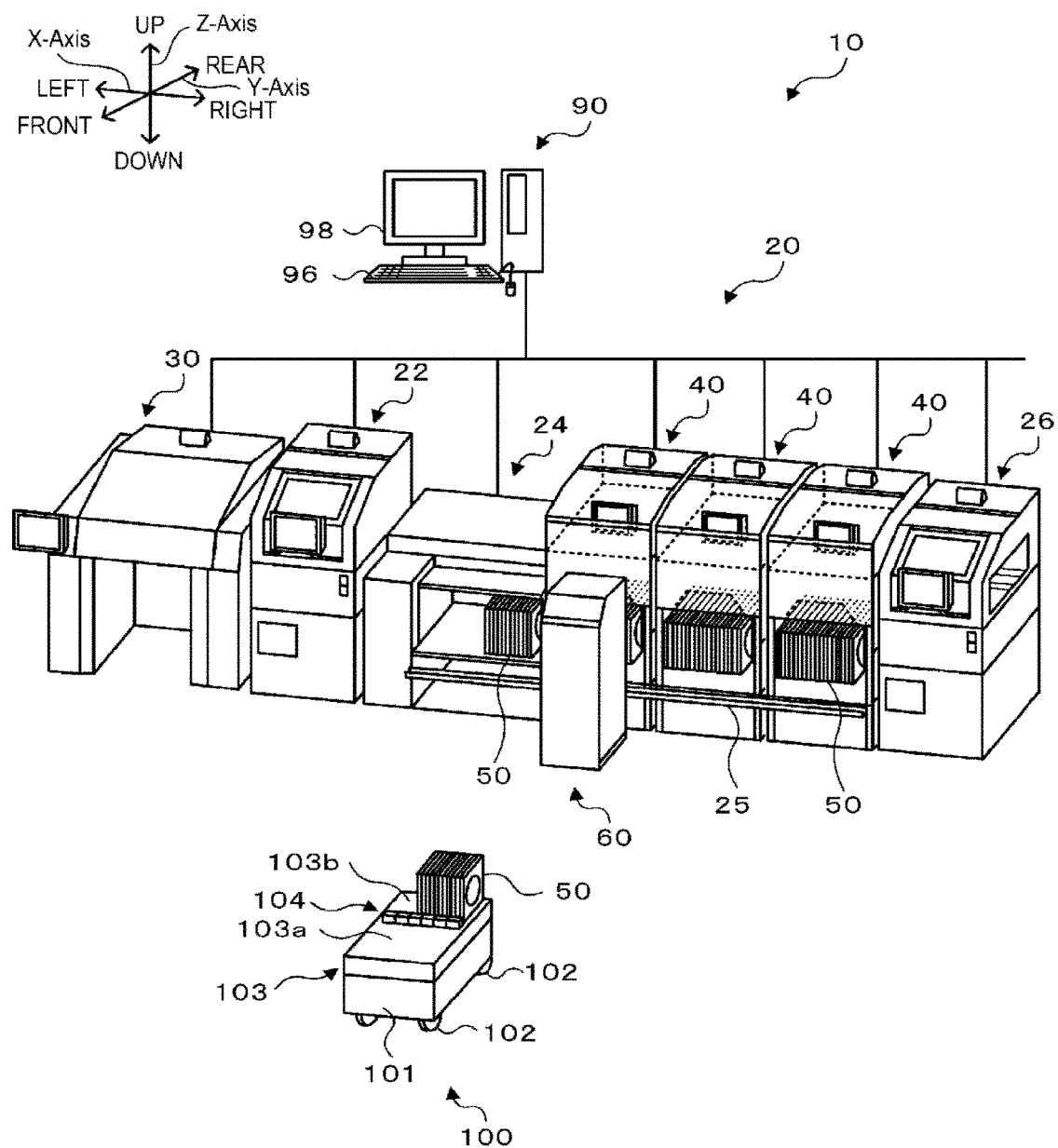
FIG. 2 is a summary block diagram of work line 20, management device 90, and unmanned conveyance vehicle 100.
Figure 3:
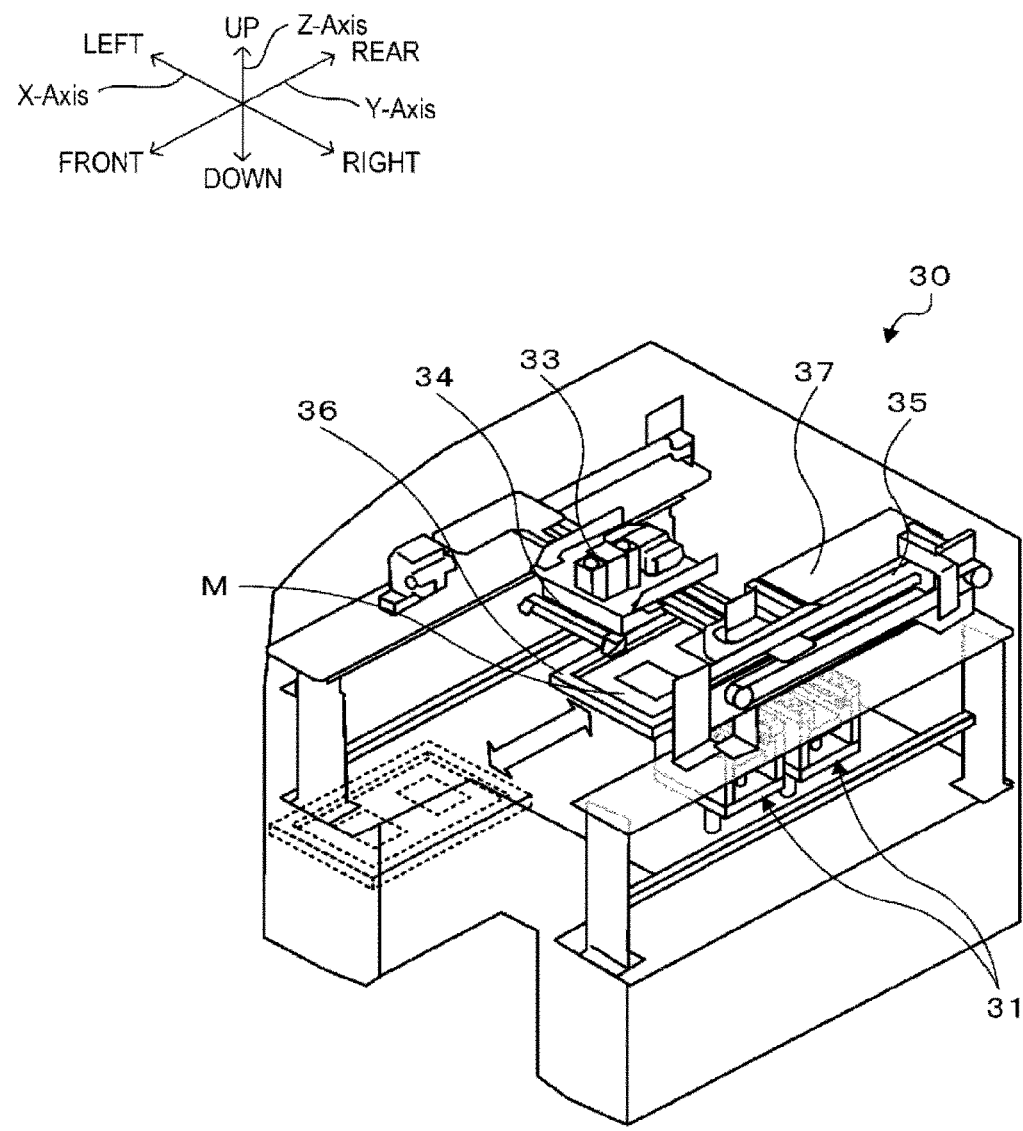
FIG. 3 is a summary block diagram of printing device 30.
Figure 4:
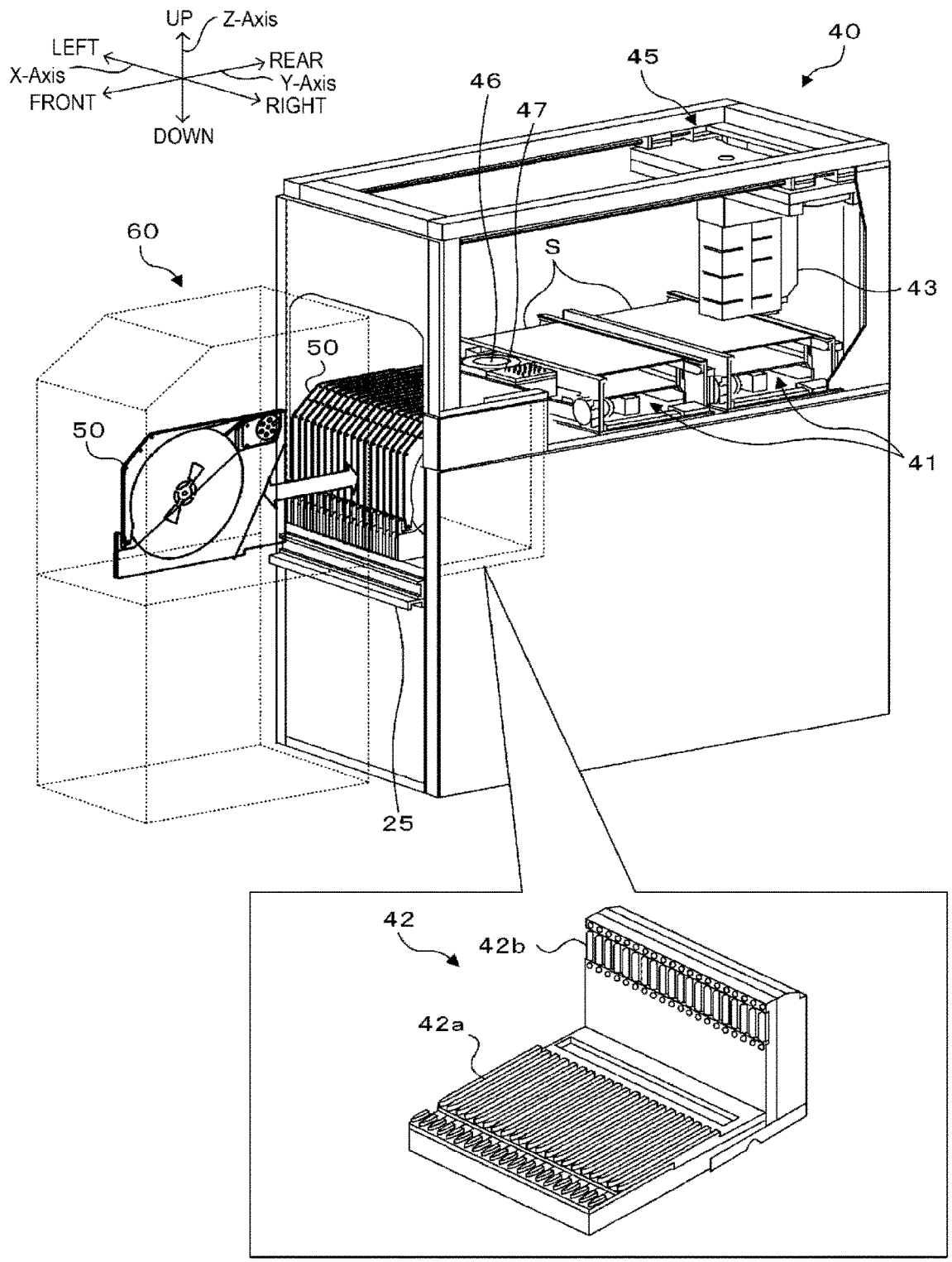
FIG. 4 is a summary block diagram of mounting device 40.
Figure 5:
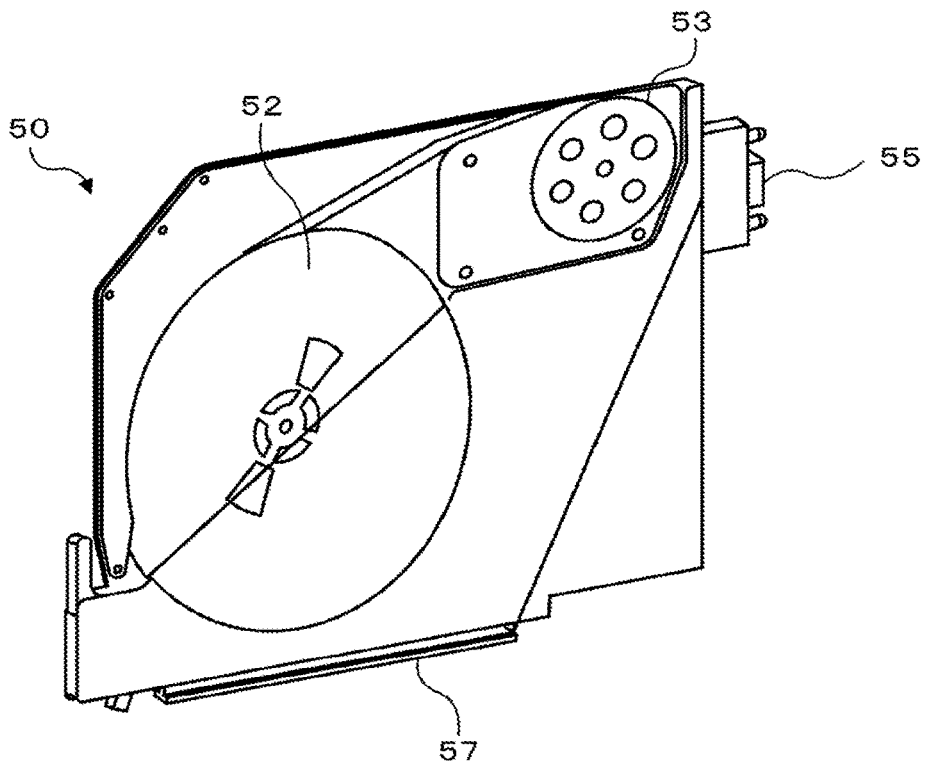
FIG. 5 is a summary block diagram of feeder 50.
Figure 6:
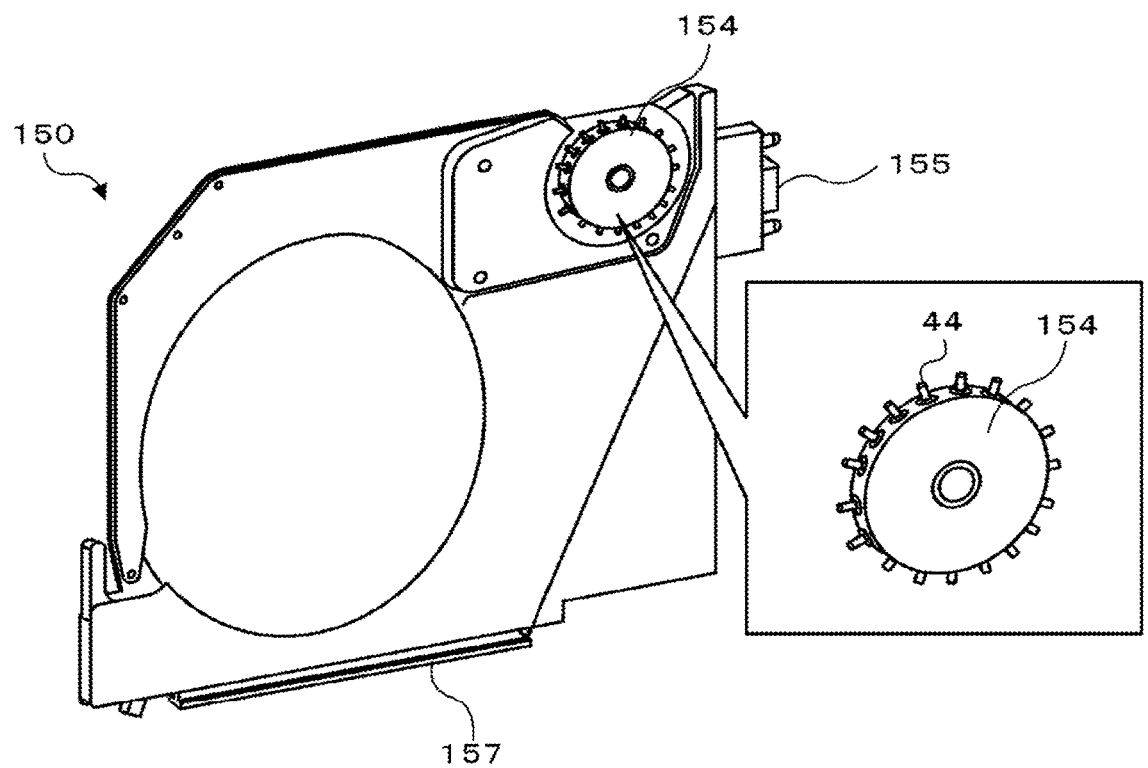
FIG. 6 is a summary block diagram of nozzle exchanging unit 150.
Figure 7:
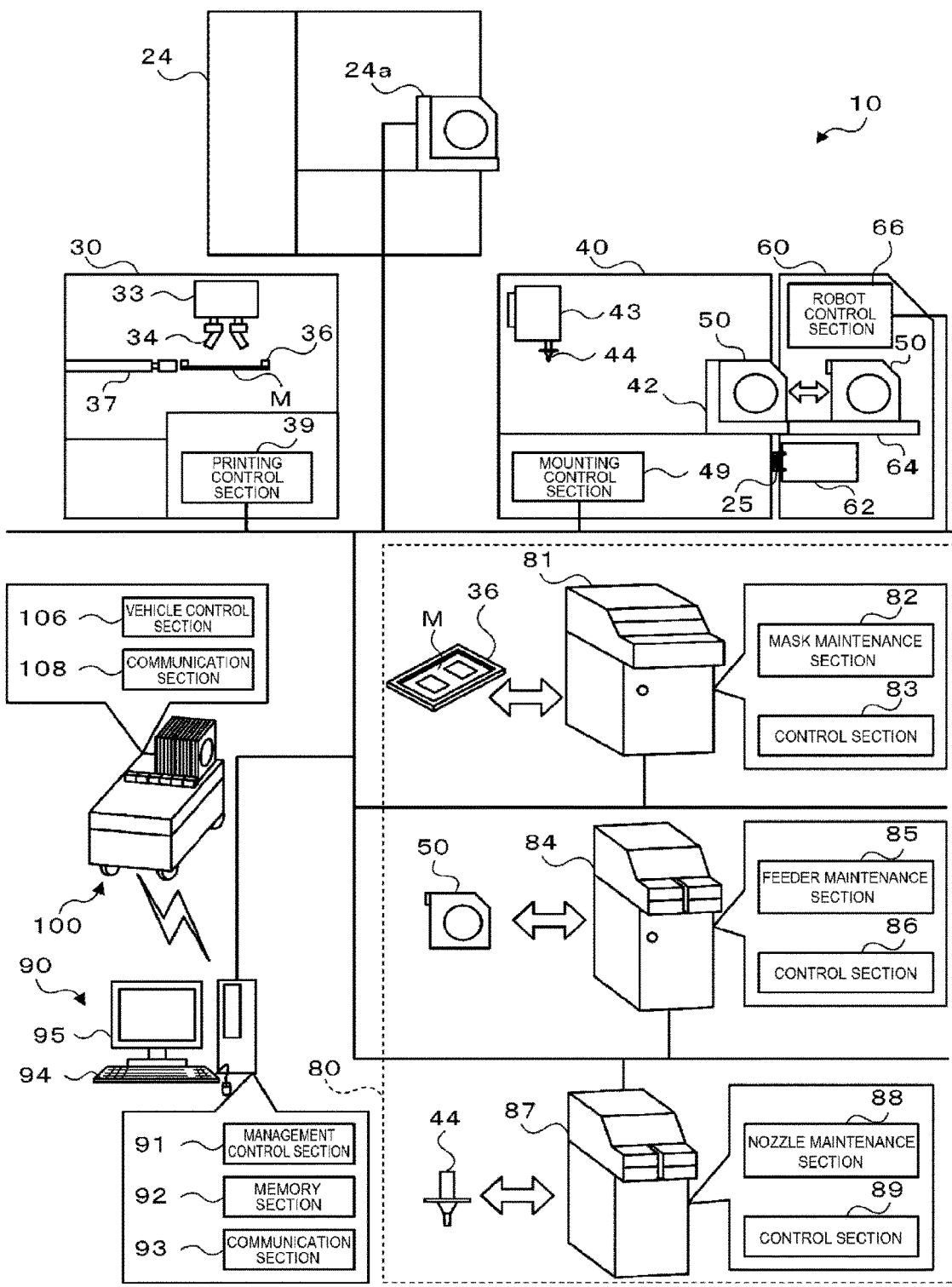
FIG. 7 is an explanatory diagram showing connecting relationships in substrate work system 10.

Next, referring to drawings, an embodiment of the present disclosure will be described. FIG. 1 is an explanatory diagram showing an example of a summary configuration of substrate work system 10, FIG. 2 is a summary block diagram of work line 20, management device 90, and unmanned conveyance vehicle 100, FIG. 3 is a summary block diagram of printing device 30, and FIG. 4 is a summary block diagram of mounting device 40. FIG. 5 is a summary block diagram of feeder 50, FIG. 6 is a summary block diagram of nozzle exchanging unit 150, and FIG. 7 is an explanatory diagram showing connecting relationships in substrate work system 10. In FIGS. 1 to 4, a left-right direction is referred to as an X-axis direction, a front-rear direction as a Y-axis direction, and an up-down direction as a Z-axis direction.

Substrate work system 10 includes, as shown in FIG. 1, work line 20, storage container 70, maintenance area 80, management device 90, and unmanned conveyance vehicle 100. Work line 20 includes multiple work devices configured to perform various types of work. Storage container 70 stores various types of work units necessary for the work. Maintenance area 80 includes multiple maintenance devices configured to perform maintenance work on the various types of work units. Management device 90 manages the whole of the system. Unmanned conveyance vehicle 100 conveys the various types of work units between work line 20, storage container 70, and maintenance area 80.

As shown in FIG. 2, work line 20 includes printing device 30, print inspection device 22, temporary storage place 24, multiple mounting devices 40, and mount inspection device 26, and these constituent units are set so as to be aligned sequentially in a conveyance direction (the X-axis direction) of substrate S (refer to FIG. 4) in that order. Temporary storage place 24 includes a feeder table 24a (refer to FIG. 7), so that multiple feeders 50 can be transferred from unmanned conveyance vehicle 100 to feeder table 24a. Additionally, work line 20 includes exchanging robot 60 configured to move along X-axis rail 25 provided in the X-axis direction for automatically exchanging feeders 50 between temporary storage place 24 and individual mounting devices 40. In addition to the devices described above, work line 20 may include a reflow device for performing a reflow process for substrate S on which components are mounted.

Printing device 30 includes substrate conveyance device 31 configured to convey and fix substrate S, printing head 33 to which squeegee 34 is attached, head moving device 35 configured to move printing head 33 in X and Y directions, and fixing frame 36 to which screen mask M is fixed. Screen mask M has pattern holes (opening sections) formed in such a manner as to correspond to a wiring pattern and is fixed to fixing frame 36 with a predetermined tension. In addition, printing device 30 includes pushing device 37 configured to push forwards screen mask M together with fixing frame 36 and printing control section 39 (refer to FIG. 7) configured to control the whole of the system. Printing device 30 prints solder on substrate S by extruding the solder into the pattern holes in screen mask M with squeegee 34. Pushing device 37 includes an abutment plate configured to be brought into abutment with fixing frame 36, a cylinder for moving the abutment plate along the Y-axis direction, and the like. With unmanned conveyance vehicle 100 situated in front thereof, printing device 30 causes pushing device 37 to push forwards screen mask M so as to transfer screen mask M to unmanned conveyance vehicle 100. Printing inspection device 22 inspects the state of the solder printed on substrate S by printing device 30.

As shown in FIG. 4, mounting device 40 includes substrate conveyance device 41 configured to convey and fix substrate 5, feeder table 42 on which multiple feeders 50, each configured to supply components, are installed, mounting head 43 having nozzle 44 (refer to FIG. 7) configured to pick up a component supplied from feeder 50, and head moving device 45 configured to move mounting head 43 in the X and Y directions. In addition, mounting device 40 includes part camera 46 set between feeders 50 and substrate conveyance device 41 to image a component picked up by and held to nozzle 44 from below, nozzle station 47 where multiple types of nozzles 44, which correspond to types of components to be picked up, are stored, and mounting control section 49 (refer to FIG. 7) configured to control the whole of the system. Mounting device 40 picks up a component supplied from feeder 50 with nozzle 44 whose type matches the type of the component and mounts the component on substrate S. Mount inspection device 26 inspects the mounting state of the component mounted by mounting device 40.

As shown in FIG. 5, feeder 50 includes tape reel 52, tape feeding mechanism 53, connector 55, and rail member 57. A tape is wound round tape reel 52, the tape having multiple recessed sections formed at equal intervals along a longitudinal direction to store components. Tape feeding mechanism 53 feeds out the tape from tape reel 52 a predetermined amount at one time by being driven by a driving motor, not shown, to thereby supply sequentially components stored on the tape to a supply position. Rail member 57 is provided at a lower end of feeder 50 and extends in the attaching direction of feeder 50. Feeder 50 is set in slot 42a on feeder table 42 of mounting device 40 or a slot on feeder table 24a of temporary storage place 24 by rail member 57 being inserted into slot 42a or the slot. With feeder 50 set, connector 55 is electrically connected with connector 42b of feeder table 42 or a connector of feeder table 24a. Information on types, number, positions of feeders 50 set on feeder table 24a of temporary storage place 24 is managed by management device 90.

Further, in the present embodiment, nozzle exchanging unit 150, having a configuration similar to that of feeder 50 and used to exchange nozzles 44, can be used. As shown in FIG. 6, nozzle exchanging unit 150 includes connector 155, rail member 157, and the like as with feeder 50, and in addition to them, nozzle exchanging unit 150 includes circular disk-type nozzle station 154 provided in a portion similar to the portion where tape feeding mechanism 53 is provided in feeder 55. In nozzle station 154, nozzles 44 are detachably attached into multiple recessed sections provided on a circumferential end face thereof, and nozzle station 154 is coupled to an output shaft of the driving motor shared with tape feeding mechanism 53. With nozzle exchanging unit 150 attached to mounting device 40, nozzle station 154 is driven to rotate by the driving motor, whereby individual nozzles 44 are sequentially supplied to a supply position. In mounting device 40, not only can nozzle 44 supplied to the supply position be attached to mounting head 43, but also nozzles 44 can be exchanged between nozzle stations 47, 154. Mounting device 40 may be configured so as to automatically exchange nozzle stations 47.

As shown in FIG. 7, exchanging robot 60 includes robot moving mechanism 62 configured to move exchanging robot 60 along X-axis rail 25, feeder transfer mechanism 64 configured to transfer feeder 50 to mounting device 40 or temporary storage place 24, and robot control section 66 configured to control the whole of the robot. Robot moving mechanism 62 includes a driving motor as a driving source, a guide roller configured to guide a movement along X-axis rail 25, and the like. Feeder transfer mechanism 64 includes a clamp section configured to clamp feeder 50, a slider configured to move the clamp section in the Y-axis direction, and the like.

Although not shown, storage container 70 includes a mask storage section configured to store screen masks M fixed to fixing frames 36, feeder storage section configured to store feeders 50, and the like. Management device 90 manages storage information on types and positions of screen masks M stored in the mask storage section and storage information on types and positions of feeders 50 stored in the feeder storage section.

Maintenance area 80 includes, as shown in FIG. 7, mask maintenance device 81, feeder maintenance device 84, and nozzle maintenance device 87. Mask maintenance device 81 includes mask maintenance section 82 configured to maintain screen masks M and control section 83 configured to control the hole of the device. Although not shown, mask maintenance section 82 cleans screen mask M by removing the solder adhering to a surface of screen mask M or the solder loaded in the pattern holes in screen mask M by supplying a cleaning agent to screen mask M. Additionally, mask maintenance section 82 may be configured, for example, to re-fix screen mask M so cleaned to fixing frame 36 with the predetermined tension.

Feeder maintenance device 84 includes feeder maintenance section 85 configured to maintain feeders 50 and control section 86 configured to control the whole of the device. Although not shown, feeder maintenance section 85 blows off dust or dirt adhering to the sprocket or the like by spraying air against tape feeding mechanism 53 of feeder 50 and then supplies a maintenance liquid in which grease is dissolved in a solvent (a cleaning agent) thereto to thereby clean feeder 50.

Nozzle maintenance device 87 includes nozzle maintenance section 88 configured to maintain nozzles 44 and control section 89 configured to control the whole of the device. Although not shown, nozzle maintenance section 88 blows off dust or dirt adhering to nozzle 44 removed from nozzle exchanging unit 150 by spraying air against nozzle 44 in question and thereafter supplies a maintenance liquid into an internal passage in nozzle 44 to thereby clean nozzle 44. Nozzle maintenance device 87 may be configured, for example, to accommodate nozzle 44, which has been completely maintained, in nozzle exchanging unit 150 and then store nozzle exchanging unit 150 in storage container 70. Alternatively, nozzle maintenance device 87 may include a nozzle storage section configured to store nozzles 44.

As shown in FIG. 7, management device 90 includes management control section 91, memory section 92, communication section 93, input device 94, and display 95. Management control section 91 is configured as a microprocessor made up mainly of CPU. Memory section 92 is a device such as HDD configured to memorize various types of information. Communication section 93 is connected with the other constituent devices so as to communicate with them by wire or wirelessly. Input device 94 includes a keyboard, a mouse, or the like with which an operator inputs various commands. Display 95 is a liquid crystal display device for displaying various types of information. Memory section 92 memorizes production programs for substrates S. Production programs are determined for types of substrates S (substrate types), and every component type is determined for the number of components to be mounted, a mounting order, a mounting position or positions, the number of substrates S to be produced, and the like. Management control section 91 transmits information on work commands or production programs individually to the constituent devices or receives information on work statuses or work results individually from the constituent devices via communication section 93.

As shown in FIG. 2, unmanned conveyance vehicle 100 includes vehicle body section 101 to which wheels 102 are attached, loading table 103 disposed on vehicle body section 101, pushing device 104 configured to push out a work unit loaded on loading table 103, vehicle control section 106 (refer to FIG. 7) configured to control the whole of the vehicle, and communication section 108 (refer to FIG. 7) configured to communicate wirelessly with management device 90. Unmanned conveyance vehicle 100 can run automatically by transmitting the power of a traveling motor, not shown, to wheels 102 and transmits a current position, a vehicle status, and the like to management device 90 by way of communication section 108. Additionally, pushing device 104 includes a transfer member configured to clamp feeder 50 or be brought into abutment with screen mask M (fixing frame 36) on loading table 103, a slider configured to move the transfer member in the Y-axis direction, and the like. Unmanned conveyance vehicle 100 can load feeders 50 and screen masks M on both front loading section 103a and rear loading section 103b of loading table 103 with the transfer member situated at a center of loading table 103, and a sensor, now shown, can detect whether feeders 50 and screen masks M are so loaded to stay on loading table 103. Additionally, loading table 103 is lifted and lowered by a lifting and lowering device, not shown. Unmanned conveyance vehicle 100 can transfer screen masks M between printing device 30 or mask maintenance device 81 and mask storage section of storage container 70, and loading table 103. Further, unmanned conveyance vehicle 100 can transfer feeders 50 or nozzle exchanging units 150 between temporary storage place 24 or feeder maintenance device 84, nozzle maintenance device 87, and the feeder storage section of storage container 70, and loading table 103.

Next, the operation of mounting system 10, which is configured as described heretofore, will be described. In mounting system 10, the individual devices operate based on information such as work commands and production programs transmitted from management control section 91 of management device 90. In addition, management control section 91 prepares information on qualities of the respective pieces of work performed by the individual devices. Management control section 91 prepares print inspection result information shown in FIG. 8 by receiving information on a print inspection result for each substrate S from print inspection device 22, prepares mounting work state information shown in FIG. 9 by receiving information on mounting work for each substrate S from mounting device 40, and prepares mount inspection result information shown in FIG. 10 by receiving information on a mount inspection result for each substrate S from mount inspection device 26. These pieces of information are stored in memory section 92. The print inspection result information shown in FIG. 8 is information in which substrate IDs of substrates S, mask IDs of screen masks M, a print pattern ID of each printing location, and information on print states such as width deviation, positional deviation, height deviation, and the like are associated with one another. The mounting work state information shown in FIG. 9 is information in which substrate IDs, component types, component numbers, mounting positions, feeder IDs of feeders 50 which supplies components, nozzle IDs of suction nozzles 44 which pick up components, and suction states are associated with one another. The suction state is information on a positional deviation and an angular deviation of a component picked up by nozzle 44 which is obtained by imaging the component by part camera 46 and processing the captured image. The mount inspection result information in FIG. 10 is information in which substrate IDs, component types, component numbers, mounting positions, and mount states are associated with one another. The mount state is information on a positional deviation and an angular deviation of a component which are measured by mount inspection device 26.

Figure 11:
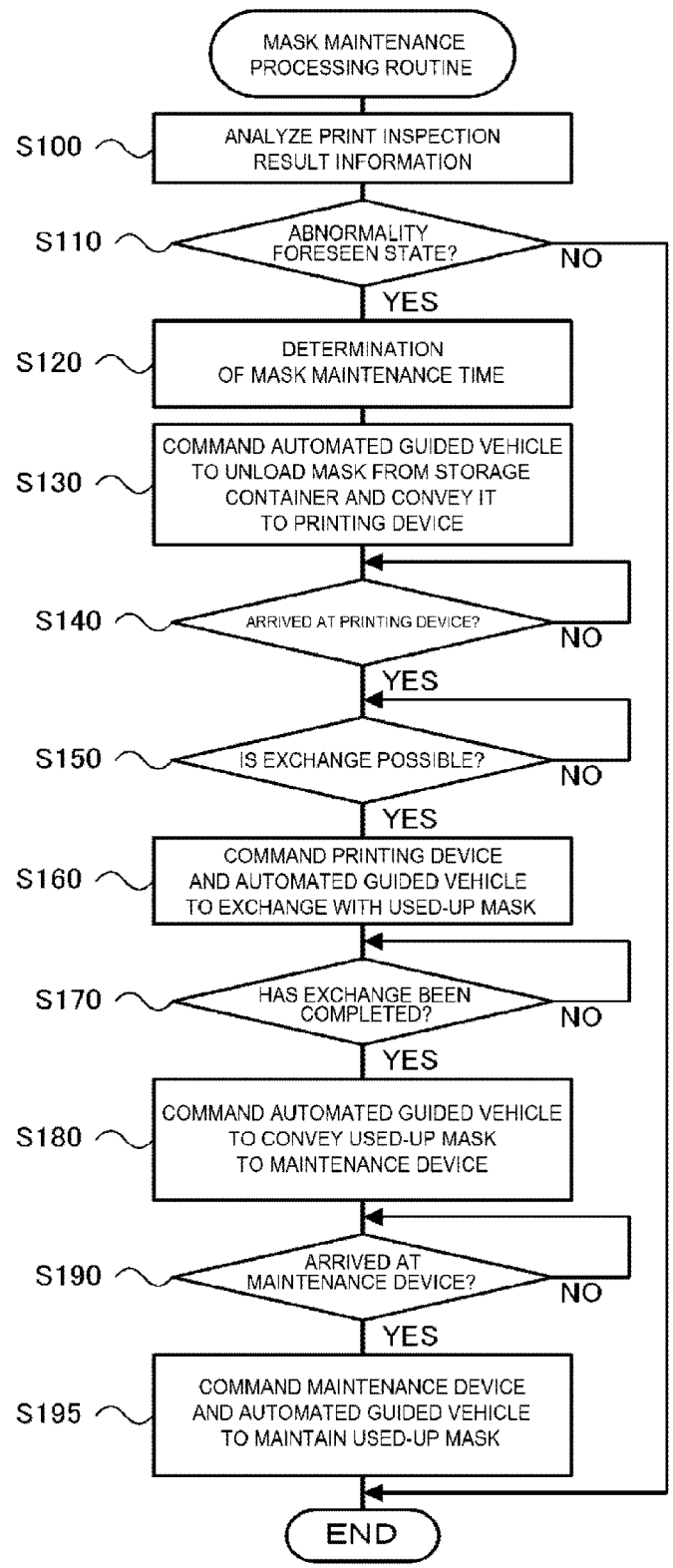
FIG. 11 is a flowchart showing a mask maintenance process routine.

Next, operations performed for maintenance of the individual devices of mounting system 10 will be described. FIG. 11 is a flowchart showing a mask maintenance processing routine. This routine is executed by management control section 91 of management device 90, for example, when the print inspection result information described above is updated. In this routine, firstly, management control section 91 analyzes print inspection result information (S100) and then determines whether the print inspection result indicates an abnormality foreseen state, which is a sign of occurrence of abnormality, caused by screen mask M (S110). Here, in the even that a deformation such as a strain is generated in screen mask to thereby expand the pattern holes or deviate positions thereof, a solder application area is increased, causing abnormality of solder width deviation, or solder application positions deviate, causing abnormality of positional deviation of solder. In addition, in the event that solder is packed in the pattern holes, the solder application area is decreased, causing abnormality of solder width deviation, or in the event that the thickness of screen mask M is reduced as a result of a surface of screen mask M being scraped, the filling height of solder in the pattern holes is reduced, causing abnormality of solder height. The instances of abnormality caused by screen mask M as described above are generated as a result of screen mask M being used repeatedly in many cases. For this reason, management control section 91 can determine on an abnormality pre-indication state before abnormality really occurs from a changing tendency of a numeric value for each of width deviation, positional deviation, and height deviation of solder by analyzing the print inspection result information. If management control section 91 determines in S110 that no such abnormality pre-indication state is present, management control section 91 ends directly the mask maintenance processing routine.

On the contrary, if management control section 91 determines in S110 that the abnormality pre-indication state is present, management control section 91 determines that a maintenance time arrives for screen mask M (S120) and transmits to unmanned conveyance vehicle 100 a command to unload screen mask K having the same pattern holes from the mask storage section of storage container 70 and convey screen mask M so unloaded to printing device 30 (S130), waiting for unmanned conveyance vehicle 100 to arrive at printing device 30 (S140). Upon receiving the command issued in S130, unmanned conveyance vehicle 100 automatically unloads screen mask M from the mask storage section and conveys it to printing device 30. Then, with unmanned conveyance vehicle 100 arriving at printing device 30, management control section 91 waits for screen mask M in question to be exchanged from the printing status of printing device 30 (S150). Upon determining that the waited exchange becomes possible as a result of substrate S on which printing work is then in process in printing device 30 having been conveyed out of printing device 30, management control section 91 transmits to printing device 30 and unmanned conveyance vehicle 100 a command to exchange used-up screen mask K which is then used in printing device 30 with screen mask M which is newly conveyed this time (S160), waiting for completion of the exchange (S170). For example, with new screen masks M loaded on rear loading section 103b, firstly, unmanned conveyance vehicle 100 directs front loading section 103a towards printing device 30 to receive used-up screen mask M pushed out of printing device 30. Next, unmanned conveyance vehicle 100 directs rear loading section 103b towards printing device 30 and pushes out new screen mask M towards printing device 30 by use of pushing device 104 to load it in an interior of printing device 30 for exchange of screen masks M in question.

When the exchange of screen masks M is performed in this way, management control section 91 transmits to unmanned conveyance vehicle 100 a command to convey used-up screen mask M so exchanged to mask maintenance device 81 (S180), waiting for unmanned conveyance vehicle 100 to arrive at mask maintenance device 81 (S190). Upon arrival of unmanned conveyance vehicle 100 at mask maintenance device 81, management control section 91 transmits to mask maintenance device 81 and unmanned conveyance vehicle 100 a command to transfer used-up screen mask M to mask maintenance device 81 to execute maintenance (S195), ending the mask maintenance processing routine. As a result, when an abnormality pre-indication state is determined which indicates the occurrence of abnormality caused by screen mask M, screen mask M in which abnormality is occurring can automatically be exchanged for maintenance, thereby making it possible to prevent in advance an abnormal quality such as a printing failure from occurring frequently. In addition, screen masks M can automatically be exchanged for maintenance at an appropriate timing matching the work status of printing device 30 without necessity of exchange work and maintenance by the operator. When the maintenance of screen mask M is completed, management control section 91 transmits to unmanned conveyance vehicle 100 a command to convey screen mask M in question to the mask storage section of storage container 70, whereby screen mask M so maintained can be stored in the mask storage section. As a result, the series of operations of exchanging screen masks M in printing device 30, maintaining used-up screen mask M, and storing screen mask M so maintained can automatically be executed by unmanned conveyance vehicle 100 without involving the operator.

Figure 12:
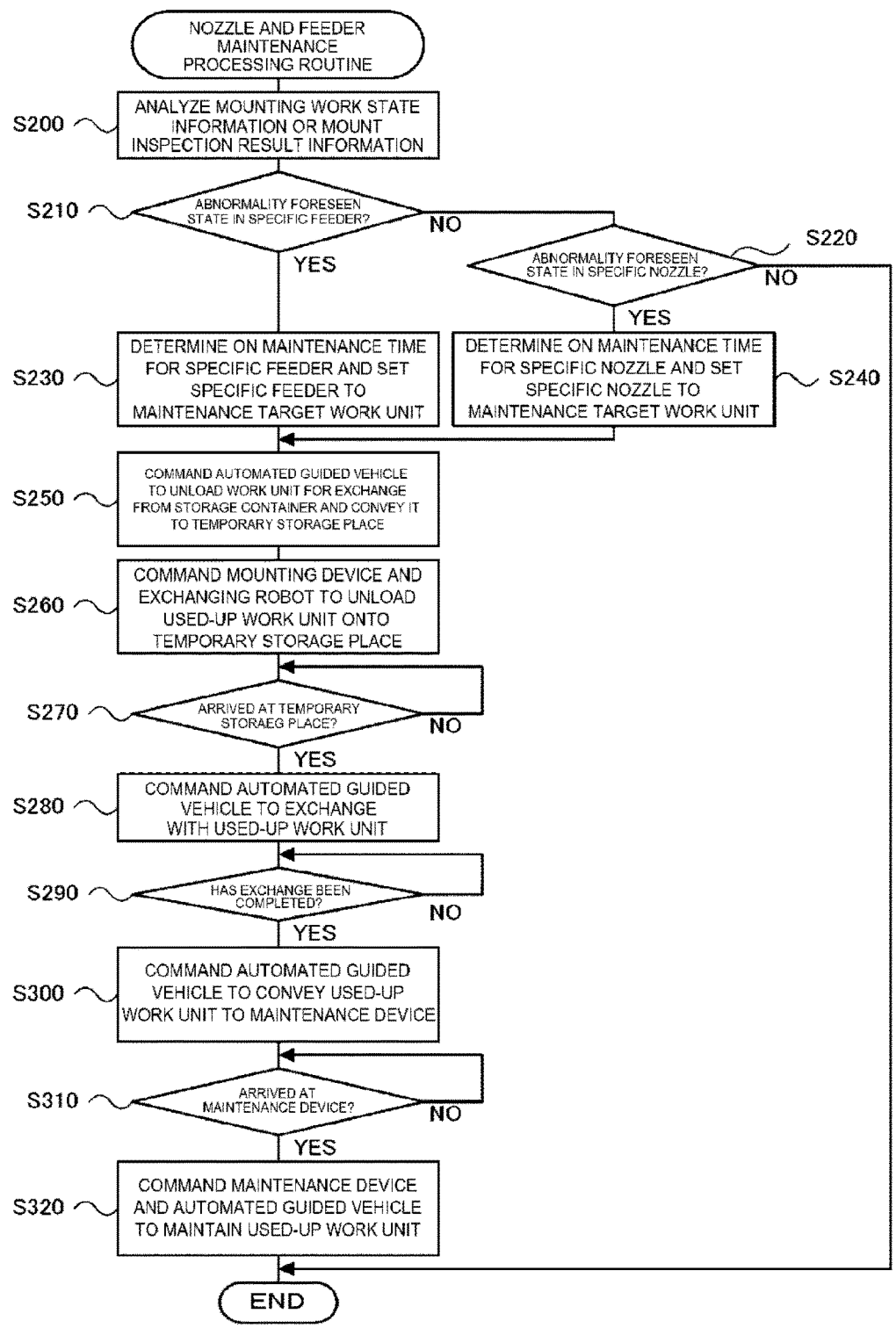
FIG. 12 is a flowchart showing a nozzle and feeder maintenance process routine.

In addition, FIG. 12 is a flowchart showing a nozzle and feeder maintenance processing routine. This routine is executed by management control section 91 when the mounting work state information or the mount inspection result information described above is updated. In this routine, firstly, management control section 91 analyses the mounting work state information or the mount inspection result information (S200) and determines whether an abnormality pre-indication state is present in which abnormality caused by specific feeder 50 is indicated (S210) or an abnormality pre-indication state is present in which abnormality caused by specific nozzle 44 is indicated (S220). Management control section 91 may analyze both the mounting work state information and the mount inspection result information in S200. Here, in the event that a feeding failure or the like occurs in tape feeding mechanism 53 of feeder 50, the supply position deviates to which a component is supplied from feeder 50 in question, and therefore, there may appear a tendency in which a positional deviation and an angular deviation of a component supplied from feeder 50 in question occur frequently. In addition, in the event that nozzle 44 is bent or dust or dirt adheres to nozzle 44, a suction failure easily occurs, and there may appear a tendency in which a positional deviation and an angular deviation of a component picked up by nozzle 44 in question occur frequently. To deal with this, management control section 91 analyzes the mounting work state information or the mount inspection result information and can determine the presence of an abnormality pre-indication state in specific feeder 50 or specific nozzle 44 from the presence of a correlation between a tendency in which respective numeric values of the positional deviation and the angular deviation change and feeder ID or nozzle ID. Upon determining that the abnormality pre-indication state is not present in both S210, S210, management control section 91 ends the nozzle and feeder maintenance processing routine.

If it determines in S210 that an abnormality pre-indication state is present in specific feeder 50, management control section 91 determines that a maintenance time arrives for specific feeder 50 and sets specific feeder 50 as a maintenance target work unit (S230). Additionally, if it determines in S220 that an abnormality pre-indication state is present in specific nozzle 44, management control section 91 determines that a maintenance time arrives for specific nozzle 44 and sets specific nozzle 44 as a maintenance target work unit (S240). Next, management control section 91 transmits to unmanned conveyance vehicle 100 a command to unload a work unit for exchange from the feeder storage section of storage container 70 and convey the work unit to temporary storage place 24 (S250). In the case of the maintenance target being feeder 50, management control section 91 issues a command to unload and convey feeder 50 for exchange which accommodates the same type of components, whereas in the case of the maintenance target being nozzle 44, management control section 91 issues a command to unload and convey nozzle exchanging unit 150 which accommodates nozzles 44 of the same type. Subsequently, management control section 91 transmits to mounting device 40 and exchanging robot 60 to unload the used-up work unit constituting the maintenance target onto temporary storage place 24 (S260), waiting for unmanned conveyance vehicle 100 to arrive at temporary storage place 24 (S270). By communicating with management control section 91, unmanned conveyance vehicle 100 waits the completion of transfer work of exchanging robot 60 transferring the used-up work unit to temporary storage place 24 and then moves to the front of temporary storage place 24. Then, if unmanned conveyance vehicle 100 arrives at temporary storage place 24, management control section 91 transmits to unmanned conveyance vehicle 100 a command to exchange the used-up work unit with a new work unit that is so conveyed this time (S280), waiting for completion of the exchange (S290).

When the exchange of the work units is executed in this way, management control section 91 transmits to unmanned conveyance vehicle 100 a command to convey the used-up work unit to a corresponding maintenance device (S300), waiting for unmanned conveyance vehicle 100 to arrive at the maintenance device (S310). In the case of a maintenance target being feeder 50, management control section 91 issues a command to convey failed feeder 50 to maintenance device 84, whereas in the case of a maintenance target being nozzle 44, management control section 91 issues a command to convey failed nozzle 44 (nozzle exchanging unit 150) to nozzle maintenance device 87, which will be true with the following operations. Then, with unmanned conveyance vehicle 100 arriving at the maintenance device, management control section 91 transmits the maintenance device and unmanned conveyance vehicle 100 a command to transfers the used-up work unit to the maintenance device (S320), ending the nozzle and feeder maintenance processing routine. As a result, since specific feeder 50 or specific nozzle 44 can automatically be exchanged at a timing at which the presence of an abnormality pre-indication state is determined in which abnormality will occur due to specific feeder 50 in question or specific nozzle 44 in question, quality abnormality such as a mounting failure can be prevented from occurring frequently in advance. When the maintenance of feeder 50 or nozzle 44 is completed, management control section 91 transmits to unmanned conveyance vehicle 100 a command to convey them to storage container 70 for storage in storage container 70. As a result, the series of operations of exchanging feeders 50 or nozzles 44, maintaining failed feeder 50 or failed nozzle 44, and subsequently storing feeder 50 or nozzle 44 so maintained can automatically be executed by unmanned conveyance vehicle 100 without involving the operator.

Here, correlations between the constituent elements of the present embodiment and constituent elements of the present disclosure will be made clear. Printing device 30 and mounting devices 40 of the present embodiment correspond to a work device, storage container 70 to a storage section, maintenance devices 81, 84, 87 to a maintenance device, unmanned conveyance vehicle 100 to a conveyance device, management control section 91, which is configured to execute the processing operations of S100 to S120 in the mask maintenance processing routine and the processing operations of S200 to S240 in the nozzle and feeder maintenance processing routine, to a determination section, and management control section 91, which is configured to execute the processing operations of S130 onwards and the processing operations of S250 onwards, to a control section.

In mounting system 10 of the present embodiment described heretofore, when the maintenance time for screen mask M is determined based on the print inspection result information, screen mask M for exchange and used-up screen mask M are automatically exchanged by unmanned conveyance vehicle 100, and used-up screen mask M is maintained by mask maintenance device 81. As a result, the print quality can be improved. In addition, in mounting system 10, when the maintenance time for feeder 50 is determined based on the mounting work state information or the mount inspection result information, feeder 50 for exchange and used-up feeder 50 are automatically exchanged by unmanned conveyance vehicle 100, and used-up feeder 50 is maintained by feeder maintenance device 84. The maintenance time for nozzle 44 is determined similarly, and the similar automatic exchange and maintenance are carried out. As a result, the mount quality can be improved.

Further, in mounting system 10, since the automatic exchange and maintenance of the individual work units can be carried out at the appropriate timings matching the work status without involving the exchange work and maintenance by the operator, an improvement in print quality or mount quality can be achieved without reducing the operating ratios of printing device 30 and mounting device 40.

In mounting system 10, in the case that the abnormality pre-indication state is present in specific feeder 50, feeder 50 in question is maintained, and in the case that the abnormality pre-indication state is present in specific nozzle 44, nozzle 44 in question is maintained, thereby making it possible to prevent an occurrence of abnormality in advance.

Mounting system 10 of the present disclosure is not limited to the embodiment described above in any way, and needless to say, mounting system 10 can be carried out in various forms without departing from the technical scope of the present disclosure.

For example, in the embodiment described above, while the maintenance times for both feeder 50 and nozzle 44 are described as being determined, the present disclosure is not limited thereto, and hence, the maintenance time for only one of feeder 50 and nozzle 40 may be determined, or a maintenance time for another work unit such as head 43 may be determined. Alternatively, a maintenance time for a work unit in either of printing device 30 and mounting device 40 may be determined.

Figure 13:
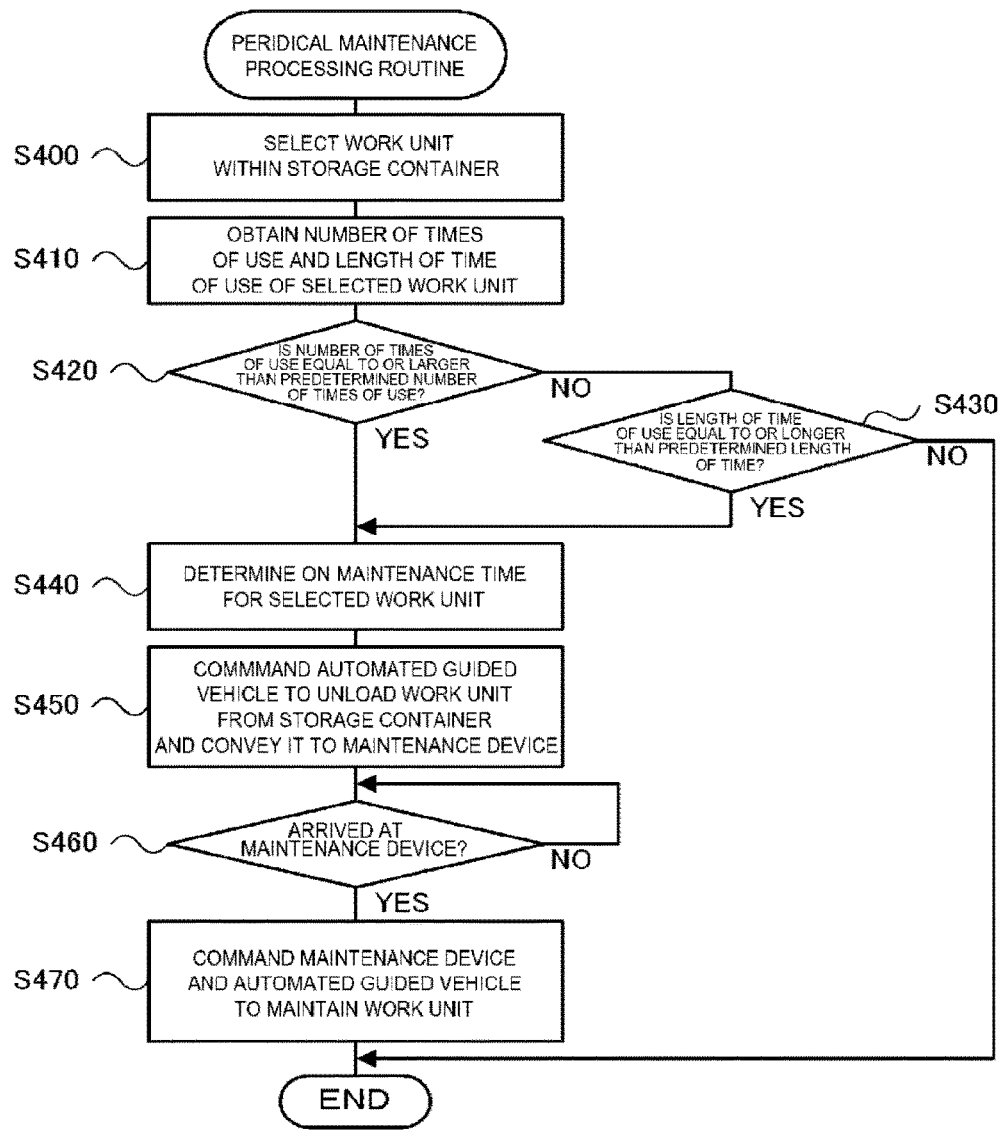
FIG. 13 is a flowchart showing a maintenance process routine according to an alternative embodiment.

In the embodiment described above, while the maintenance time for the work unit which is in use in the work device is determined, the present disclosure is not limited thereto, A maintenance time for a work unit stored in storage container 70 may be determined, the work unit including screen mask M stored in storage container 70 after screen mask M in question is used in and removed from printing device 30 due to a change in substrate type or the like, feeder 50 or nozzle 44 (nozzle exchanging unit 150) stored in storage container 70 after feeder 50 in question or nozzle 44 in question is used in and removed from mounting device 40 due to a change in substrate type or the like, and the like. FIG. 13 is a flowchart showing a periodical maintenance processing routine according to an alternative embodiment. This processing routine is executed by management control section 91 of management device 90 at a periodical timing.

In this periodical maintenance processing routine, firstly, management control section 91 selects a work unit stored in storage container 70 as a processing target (S400), Management control section 91 selects a work unit newly stored in storage container 70 this time as a processing target. Next, management control section 91 obtains the number of times of using the selected work unit and a length of time when the selected work unit is used (S410). The number of times of using the work unit is referred to as the number of times of printing (the number of prints) made on substrates S using screen mask M, the number of components supplied by feeder 50, or the number of components picked up by nozzle 44 and is to be reset every time maintenance is carried out. In addition, the length of time when the selected work unit is used is referred to as a time spent from a start of work on first substrate S after the selected work unit is attached to the work device to a removal of the selected work unit from the work device, Subsequently, management control section 91 determines both whether the number of times of using the selected work unit is equal to or larger than a predetermined number of times (S420) and whether the length of time when the selected work unit is used is equal to longer than a predetermined time (S430). Upon determining that the number of times of using the selected work unit is equal to or larger than the predetermined number of times or that the length of time when the selected work unit is used is equal to or longer than the predetermined time, management control section 91 determines that it is then a periodical maintenance time for the selected work unit (S440), whereas upon determining that the number of times of using the selected work unit is not equal to or larger than the predetermined number of times or that the length of time when the selected work unit is used is not equal to or longer than the predetermined time, management control section 91 ends the periodical maintenance processing routine. Upon determining that it is the periodical maintenance time for the selected work unit, management control section 91 transmits to unmanned conveyance vehicle 100 a command to unload the selected work unit from storage container 70 and convey it to the corresponding maintenance device (S450), waiting for unmanned conveyance vehicle 100 to arrive at the maintenance device (S460). Then, when unmanned conveyance vehicle 100 arrives at the maintenance device, management control section 91 transmits to the maintenance device and unmanned conveyance vehicle 100 a command to transfer the selected work unit to the maintenance device for maintenance (S470), ending the periodical maintenance processing routine. As a result, the maintenance of the selected work unit can be carried out at the periodic timing in an ensured fashion without the necessity of execution of the conveyance and maintenance of the selected work unit by the operator. In addition, the operating ratio of the work unit is not affected in any way. Therefore, the work quality can be improved without reducing the operating ratio. The present disclosure is not limited to the configuration in which the periodical maintenance time is determined by use of both the number of times of using and the length of time of using the selected work unit, and hence, the periodical maintenance time may be determined by use of either of the number of times of using and the length of time of using the selected work unit. Alternatively, an arrival of the periodical maintenance time may be determined when a period during which the selected work unit is stored in storage container 70 is equal to or longer than a predetermined length of time.

Further, the determination of the maintenance time based on the number of times of using or the length of time of using the selected work unit may be applied to a work unit which is being used in the work device. That is, there may be adopted a configuration in which when management control section 91 determines a periodical maintenance time for the work unit which is being used in the work device based on either or both of the number of times of using and the length of time of using the work unit, and when management control section 91 determines that a periodical maintenance time arrives, the work unit determined to arrive at its maintenance time is automatically exchanged by unmanned conveyance vehicle 100 so as to be maintained.

In the embodiment described above, while the work unit is conveyed by unmanned conveyance vehicle 100 configured to run automatically, the work unit may be conveyed by a conveyor device, as long as the work unit can automatically be conveyed. In addition, while the configuration is adopted in which exchanging robot 60 is provided on mounting line 20 and unmanned conveyance vehicle 100 is configured to transfer feeder 50 or the like onto temporary storage place 24, the present disclosure is not limited thereto, and hence, a configuration may be adopted in which unmanned conveyance vehicle 100 transfers feeder 50 or the like directly to individual mounting devices 40.

In the substrate work system of the present disclosure, the work device can also be a mounting device which uses a feeder for supplying components and a nozzle for picking up the components as the working unit and performs, as the predetermined work, the mounting work of picking up the component supplied from the feeder and mounting the component so picked up onto the substrate, and the determination section can determine on a maintenance time for each of the feeder and the nozzle based on state information on at least either of a suction state of the component and a mount state of the component as the quality information. As a result, since the feeder and the nozzle, which are used for the mounting work of the mounting device, can automatically exchanged for maintenance at an appropriate timing, the mounting quality can be improved without reducing the operating ratio of the mounting device.

In the substrate work system of the present disclosure, the determination section determines whether at least either of the suction state and the mount state is in an abnormality pre-indication state, which results before either of the suction state and the mount state is brought into an abnormal state, based on the state information, and in the case that the component supplied from a specific feeder is in the abnormality pre-indication state, the determination section can determine that a maintenance time arrives for the specific feeder, whereas in the case that the component picked up by a specific nozzle is in the abnormality pre-indication state, the determination section can determine that a maintenance time arrives for the specific nozzle. As a result, the maintenance of the work unit can be maintained at a timing before an occurrence of abnormality caused by the feeder or the nozzle. This can prevent in advance an occurrence of abnormality caused by the feeder or the nozzle, thereby making it possible to improve further the mounting quality while suppressing the reduction in the operating ratio of the mounting device.

In the substrate work system of the present disclosure, the work device can also be a printing device which uses a mask in which an opening section is formed as the work unit and performs, as the predetermined work, printing work of loading a viscous fluid into the opening section in the mask to print the viscous fluid onto the substrate, and the determination section determines on a maintenance time for the mask based on state information on a print state of the viscous fluid as the quality information. As a result, since the mask used in printing work can automatically be exchanged for maintenance at an appropriate timing, the printing accuracy can be improved without reducing the operating ratio of the printing device.

The gist of the boar work system of the present disclosure is that the substrate work system is a substrate work system including a work device configured to perform predetermined work on a substrate by use of an exchangeable work unit, the substrate work system including a storage section configured to store the work unit, a maintenance device configured to perform maintenance of the work unit, a conveyance device capable of conveying the work unit, a determination section configured to determine a periodical maintenance time for the work unit stored in the storage section, and a control section configured to, when the determination section determines that the maintenance time arrives, cause the conveyance device and the maintenance device to unload the work unit constituting a maintenance target from the storage section, convey the work unit so unloaded to the maintenance device so as to be maintained thereby.

In the substrate work system of the present disclosure, in the case that the periodical maintenance time is determined to arrive for the work unit stored in the storage section, the work unit constituting a maintenance target is unloaded from the storage section and is then conveyed to the maintenance device so as to be maintained by the maintenance device. As a result, the work unit on which the periodical maintenance has been carried out can be used in the work device, which can be linked with an improvement in work quality. In addition, since the work unit can automatically be exchanged for maintenance at the periodical timing without the necessity of conveyance and maintenance by the operator, the operating ratio of the work device can be made free from being affected in any way. Therefore, the work quality can be improved without reducing the operating ratio. The periodical maintenance can be determined based on the number of times of using and/or the length of time of using the work unit.

INDUSTRIAL APPLICABILITY

The present disclosure is applicable to a technical field in which predetermined work is performed on a substrate by use of an exchangeable work unit.

REFERENCE SIGNS LIST

10 Substrate work system, 20 Work line, 22 Print inspection device, 24 Temporary storage place, 24a Feeder table, 25 X-axis rail, 26 Mount inspection device, 30 Printing device, 31 substrate conveyance device, 33 Printing head, 34 Squeegee, 35 Head moving device, 36 Fixing frame, 37 Pushing device, 39 Printing control section, 40 Mounting device, 41 substrate conveyance device, 42 Feeder table, 42a Slot, 42b Connector, 43 Mounting head, 44 Nozzle, 45 Head moving device, 46 Part camera, 47 Nozzle station, 49 Mounting control section, 50 Feeder, 52 Tape reel, 53 Tape feeding mechanism, 55, 155 Connector, 57,157 Rail member 60 Exchanging robot, 62 Robot moving mechanism, 64 Feeder transfer mechanism, 66 Robot control section, 70 Storage container, 80 Maintenance area, 81 Mask maintenance device, 82 Mask maintenance section, 83,86,89 Control section, 84 Feeder maintenance section, 85 Feeder maintenance section, 87 Nozzle maintenance section, 88 Nozzle maintenance section, 90 management device, 91 management control section, 92 Memory section, 93 Communication section, 94 Input device, 95 Display, 100 Unmanned conveyance vehicle, 101 Vehicle body section, 102 Wheel, 103 Loading table, 103a, 103b Loading section, 104 Pushing device, 106 Vehicle control section, 108 Communication section, 150 Nozzle exchanging unit, 154 Nozzle station, M Screen mask, S substrate.

The invention claimed is:

1. A substrate work system comprising:
   a work device configured to perform predetermined work on a substrate using an exchangeable work unit of a plurality of work units, the work device being disposed on a work line;
   a storage section configured to store the plurality of work units, the storage section being disposed separate from the work device and the work line;
   a maintenance device configured to perform maintenance of the plurality of work units, the maintenance device being disposed separate from the work device and the work line;
   an unmanned conveyance vehicle capable of conveying at least one work unit of the plurality of work units, the unmanned conveyance vehicle including a vehicle body section, wheels attached to the vehicle body section, and a loading table disposed on the vehicle body section; and
   circuitry configured to automatically
      determine an abnormality pre-indication state for a work unit that is being used by the work device based on quality information of the performed predetermined work, wherein the work unit that is being used by the work device does not cause an abnormality in the abnormality pre-indication state; and
      when the work unit that is being used by the work device is in the abnormality pre-indication state, cause the unmanned conveyance vehicle, the work device, and the maintenance device to
         unload a new work unit from the work units stored in the storage section for exchange,
         convey the new work unit to the work device, for being exchanged with the work unit that was being used by the work device, and
         convey the work unit that was being used by the work device to the maintenance device so as to be maintained thereby.

2. The substrate work system according to claim 1, wherein the work device is a mounting device, wherein the work unit is a feeder configured to supply a component and a nozzle configured to pick up the component and the nozzle further configured to perform, as the predetermined work, picking up the component supplied from the feeder and mounting the component that was picked up on the substrate, wherein the maintenance device includes a feeder maintenance section configured to clean the feeder, and a nozzle maintenance section configured to clean the nozzle, and wherein the circuitry is configured to determine the abnormality pre-indication state for the feeder and the nozzle based on state information on at least either of a suction state of the component and a mount state of the component, the state information on at least either of the suction state of the component and the mount state of the component being the quality information.

3. The substrate work system according to claim 1, wherein the work device is a printing device, wherein the work unit is a mask having an opening section formed therein and configured to perform, as the predetermined work, printing work of loading a viscous fluid into the opening section in the mask to thereby print the viscous fluid on to the substrate, wherein the maintenance device includes a mask maintenance section configured to clean the mask, and wherein the circuitry is configured to determine the abnormality pre-indication state for the mask based on a print state of the viscous fluid, the print state of the viscous fluid being the quality information.

4. A substrate work system comprising:

a work device configured to perform predetermined work on a substrate using an exchangeable work unit of a plurality of work units, the work device being disposed on a work line;

a storage section configured to store the plurality of work units, the storage section being disposed separate from the work device and the work line;

a maintenance device configured to perform maintenance of the plurality of work units, the maintenance device being disposed separate from the work device and the work line;

an unmanned conveyance vehicle capable of conveying at least one work unit of the plurality of work units, the unmanned conveyance vehicle including a vehicle body section, wheels attached to the vehicle body section, and a loading table disposed on the vehicle body section; and circuitry configured to automatically
 determine a periodical maintenance time for the work unit stored in the storage section when a length of time that the work unit has been stored in the storage section is greater than a predetermined time; and
 when the periodical maintenance time has arrived, cause the unmanned conveyance vehicle to unload work unit stored in the storage section and convey the work unit that had been stored in the storage section to the maintenance device so as to be maintained thereby.

* * * * *